(12) United States Patent
Savanth et al.

(10) Patent No.: US 10,394,732 B2
(45) Date of Patent: Aug. 27, 2019

(54) INTERFACE DEVICE FOR A DATA PROCESSING SYSTEM

(71) Applicant: ARM LIMITED, Cambridge (GB)

(72) Inventors: Parameshwarappa Anand Kumar Savanth, Cambridge (GB); James Edward Myers, Bottisham (GB); David Walter Flynn, Cambridge (GB); Rohan Gaddh, Cambridge (GB); Rohit Grover, Stapleford (GB)

(73) Assignee: ARM Limited, Cambridge (GB)

( * ) Notice: Subject to any disclaimer, the term of this patent is extended or adjusted under 35 U.S.C. 154(b) by 248 days.

(21) Appl. No.: 15/219,466

(22) Filed: Jul. 26, 2016

(65) Prior Publication Data

US 2018/0032455 A1 Feb. 1, 2018

(51) Int. Cl.
| | |
|---|---|
| *G06F 9/4401* | (2018.01) |
| *G06F 13/28* | (2006.01) |
| *G06F 13/24* | (2006.01) |
| *G11C 11/406* | (2006.01) |
| *G06F 1/3287* | (2019.01) |

(52) U.S. Cl.
CPC ............ *G06F 13/28* (2013.01); *G06F 9/4418* (2013.01); *G06F 13/24* (2013.01); *G11C 11/40615* (2013.01); *G06F 1/3287* (2013.01)

(58) Field of Classification Search
CPC .... H03M 7/30; H03M 7/3059; H03M 7/6064; G06F 2212/401; G06F 9/4418; G06F 13/24; G06F 13/28; G06F 1/3287; G11C 11/40615
See application file for complete search history.

(56) References Cited

U.S. PATENT DOCUMENTS

| | | | |
|---|---|---|---|
| 7,394,410 B1 * | 7/2008 | Wegener .................. | H03M 7/30 341/50 |
| 2011/0246206 A1 * | 10/2011 | Kim ....................... | G10L 19/167 704/500 |

OTHER PUBLICATIONS

M. Fojtik et al., "A Millimeter-Scale Energy-Autonomous Sensor System with Stacked Battery and Solar Cells", *IEEE Journal of Solid-State Circuits*, vol. 48, No. 3, Mar. 2013, pp. 801-813.
F. Marcelloni et al., "A Simple Algorithm for Data Compression in Wireless Sensor Networks", *IEEE Communications Letters*, vol. 12, No. 6, Jun. 2008, pp. 411-413.
N. Kimura et al., "A Survey on Data Compression in Wireless Sensor Networks", *IEEE Computer Society*, Apr. 4, 2005, 6 pages.
F. Chen et al., "Design and Analysis of a Hardware-Efficient Compressed Sensing Architecture for Data Compression in Wireless Sensors", *IEEE Journal of Solid-State Circuits*, vol. 47, No. 3, Mar. 2012, pp. 744-756.

(Continued)

*Primary Examiner* — Ernest Unelus
(74) *Attorney, Agent, or Firm* — Nixon & Vanderhye P.C.

(57) ABSTRACT

An interface device for a data processing system is provided. The interface device comprises first interface circuitry to receive incoming data and second interface circuitry to transmit processed data to a data store for storage. The interface device is provided with processing circuitry to generate the processed data from the incoming data wherein the processing carried out reduces the data in size. The processing circuitry is also responsive to at least one characteristic of the incoming data or the processed data to transmit a notification signal to a data processing component of the data processing system.

19 Claims, 10 Drawing Sheets

(56) References Cited

OTHER PUBLICATIONS

B. Zhai et al., "Energy-Efficient Subthreshold Processor Design", *IEEE Transactions on Very Large Scale Integration (VLSI) Systems*, vol. 17, No. 8, Aug. 2009, pp. 1127-1137.

J. Kwong et al., "A 65 nm Sub-$V_t$ Microcontroller with Integrated SRAM and Switched Capacitor DC-DC Converter", *IEEE Journal of Solid-State Circuits*, vol. 44, No. 1, Jan. 2009, pp. 115-126.

D. Bol et al., "Sleepwalker: A 25-MHz 0.4-V Sub-mm$^2$ 7-μW/MHz Microcontroller in 65-nm LP/GP CMOS for Low-Carbon Wireless Sensor Nodes", *IEEE Journal of Solid-State Circuits*, vol. 48, No. 1, Jan. 2013, pp. 20-32.

Digi-Key Electronics, "Microcontrollers for Low Energy Smart Power Applications" Aug. 22, 2012, 6 pages.

\* cited by examiner

INTERFACE DEVICE FOR A DATA PROCESSING SYSTEM

TECHNICAL FIELD

The present disclosure relates to data processing systems. More particularly it relates to an interface device for a data processing system.

BACKGROUND

Within a data processing system there may be the need for certain data which is generated or received to be stored in a data store. In order to limit the space occupied in the data store by this data it may be compressed before being stored. The need to perform this data compression may be particularly acute in the case of a small data processing system with only limited storage capacity. However such a small data processing system may also have limited processing capability and a limited power supply, so that data compression represents a task burden requiring careful management.

SUMMARY

At least one example described herein is an interface device for a data processing system comprising: first interface circuitry to receive incoming data; second interface circuitry to transmit processed data to a data store for storage; and processing circuitry to generate the processed data from the incoming data, wherein the processed data has a smaller size than the incoming data, and wherein the processing circuitry is responsive to at least one characteristic of the incoming data or the processed data to transmit a notification signal to a data processing component of the data processing system.

At least one example described herein is a data processing system comprising: a data processing component; a data store; and an interface device comprising: first interface circuitry to receive incoming data; second interface circuitry to transmit processed data to the data store for storage; and processing circuitry to generate the processed data from the incoming data, wherein the processed data has a smaller size than the incoming data, and wherein the processing circuitry is responsive to at least one characteristic of the incoming data or the processed data to transmit a notification signal to the data processing component.

At least one example described herein is a method of operating an interface device for a data processing system comprising: receiving incoming data at a first interface; transmitting processed data to a data store for storage from a second interface; generating the processed data from the incoming data, wherein the processed data has a smaller size than the incoming data; and transmitting a notification signal to a data processing component of the data processing system in response to at least one characteristic of the incoming data or the processed data.

At least one example described herein is an interface device for a data processing system comprising: first interface means for receiving incoming data; second interface means for transmitting processed data to a data store for storage; means for generating the processed data from the incoming data, wherein the processed data has a smaller size than the incoming data; and means for transmitting a notification signal to a data processing component of the data processing system in response to at least one characteristic of the incoming data or the processed data.

BRIEF DESCRIPTION OF THE DRAWINGS

The present techniques will be described further, by way of example only, with reference to embodiments thereof as illustrated in the accompanying drawings, in which.

DESCRIPTION OF EXAMPLE EMBODIMENTS

Figure 1A:
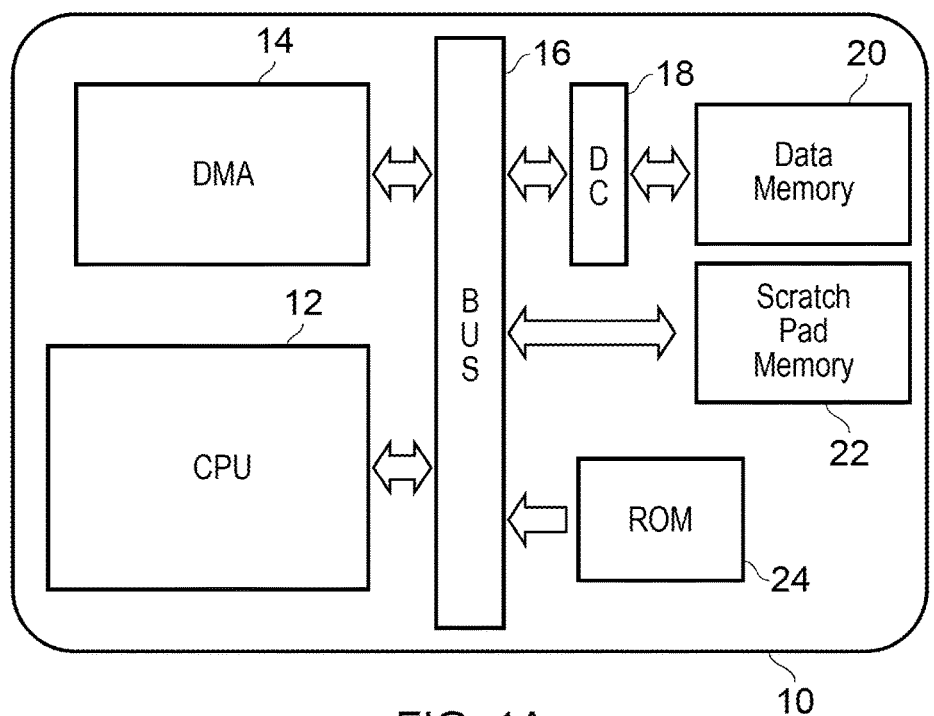
FIG. 1A schematically illustrates a data processing system comprising an interface device in one embodiment.

In some example embodiments there is an interface device for a data processing system comprising: first interface circuitry to receive incoming data; second interface circuitry to transmit processed data to a data store for storage; and processing circuitry to generate the processed data from the incoming data, wherein the processed data has a smaller size than the incoming data, and wherein the processing circuitry is responsive to at least one characteristic of the incoming data or the processed data to transmit a notification signal to a data processing component of the data processing system.

The present techniques recognise that in the context of a data processing system, most notably in a small data processing system with limited capabilities, that striking the right balance between a requirement to reduce the size of data to be stored to a data store and the desire to limit the processing requirements placed on a data processing component of the data processing system can be a difficult challenge. For example, it is often the case in such data processing systems that the data processing component executes software to perform the reduction in data size (say by running data compression software) and therefore that the data processing component will be actively involved each time an item of data is to be stored to the data store. In consequence this means that the data processing component must remain in, or at least often return to, an active configuration which can be a drain on a limited available power supply. In this context the inventors of the present techniques have provided an interface device for the data processing system, for example to be situated between a system bus and a memory of the data processing system, which itself has processing circuitry which is capable of processing the data that it passes to the data store, in particular to reduce the size of that data. Nevertheless, the inventors have further realised that it may not be possible or desirable indefinitely to avoid involvement of the data processing component, since situations can arise where it is needed. For example, when the finite storage capacity of the data store is close to full occupation, the data processing component may be required to remove some stored data, say for transmission elsewhere, to allow further data to continue to be stored to the data store. Other situations are also contemplated however where the involvement of the data processing component is required, for example based on what the data represents, such as when it is recognised that the data indicates that a certain event has occurred, to which it is required that the data processing component reacts. Accordingly the present techniques provide the interface device with the capability (in the processing circuitry) to respond to at least one characteristic of the data (whether before or after it is reduced in size) to transmit a notification signal to the data processing component. Overall this approach then means that the interface device can dynamically process the data which it passes to the data store, without other data processing components of the data processing system (for example such as a CPU or DMA) even being aware of its existence. Moreover this approach also supports a configuration in which the size of the data store can be reduced, since it can be arranged that the data processing component removes data from the store each time it is notified that the data store is, say, close to fill capacity. A smaller data store size is also supported by the reduction in size of the data which the interface device provides. Overall therefore a reduced memory footprint and fewer memory accesses are supported.

The manner in which the processing circuitry of the interface device reduces the size of the data may take a variety of forms, but in some embodiments the processing circuitry comprises compression circuitry to perform a compression operation on the incoming data to generate the processed data. The compression circuitry may be arranged to perform any suitable compression, depending on the requirements of the system, the nature of the data being handled, and so on.

Nevertheless even when such compression circuitry is provided it may not always be actively used, for example depending on the nature of the data being processed and whether the size reduction achievable by the compression is deemed to be worth the energy expenditure of operating the compression circuitry. Accordingly some embodiments further comprise compression selection circuitry selectively to use the compression circuitry in response to a compression enable signal.

As mentioned above, the compression performed by the compression circuitry may take a variety of forms, but in some embodiments the compression operation comprises at least one of: run length encoding; and representing the processed data in an n-tuple structure. For example a two tuple structure may be generated, the first tuple giving a set of data values, and the second tuple giving the count of how many times each data value has repeated. Significant compression of the data can thus be achieved.

The processed data which is stored in the data store may later be accessed and handled in a variety of ways. For example when the data is written to the data store in a compressed format, it may later be retrieved in that compressed format and transmitted elsewhere, leaving the processing burden of performing the decompression to another device. However, in some embodiments the processing circuitry further comprises decompression circuitry, and the second interface circuitry is responsive to reception of compressed data from the data store to transmit the compressed data to the decompression circuitry, the decompression circuitry is responsive to reception of the compressed data from the second interface circuitry to perform a decompression operation on the compressed data to generate decompressed data, and the first interface circuitry is responsive to reception of the decompressed data from the decompression circuitry to transmit the decompressed data to a further component of the data processing system. Accordingly, this means that data passing one way through the interface device can be compressed, whilst when it passes the other way through the interface device it is decompressed. As a result this means that less storage space in the data store is occupied and yet the rest of the system to which the interface device belongs need have no awareness of the compression and decompression which the interface device performs.

When such decompression circuitry is present in the interface device, in some embodiments the interface device may further comprise decompression selection circuitry selectively to use the decompression circuitry in response to a decompression enable signal. This provides the interface device with the ability to decompress the compressed data when it is desired to do so (and thus leaving the entire compression/decompression process transparent to the remainder of the data processing system), but also allowing the decompression circuitry not to be used at times, for example allowing another component (either of this data processing system or of another) to perform the decompression.

The processing which the interface device performs on the data which it conveys may take a variety of forms, but in some embodiments the processing circuitry comprises pre-processing circuitry to perform a pre-processing operation on the incoming data, wherein the pre-processing operation comprises at least one of: filtering the incoming data; difference encoding the incoming data; applying a threshold cut to the incoming data; and calculating a dynamic average from the incoming data. These techniques, as distinct from an explicit compression operation, nevertheless can each facilitate a reduction in size of the data. The filtering of the incoming data may filter based on any characteristic of the data, where it is known that certain data may be discarded. One example of pre-processing the data is to apply a threshold cut, for example where it is known that only data values above a threshold need be stored and therefore that received values below that threshold can simply be discarded. A dynamic average calculation also enables a reduction in size of the processed data to be achieved, wherein even if the data values received are changing, if this change is relatively slow (i.e. the change from data value to data value is relatively small), then an efficient representation of the sequence of data values may be achieved by representing each is a difference with respect to a dynamic average.

The notification signal to the data processing component of the data processing system may take a variety of forms, in particular depending on the nature of that data processing component. However in some embodiments the processing circuitry comprises interrupt generation circuitry to generate an interrupt as the notification signal for the data processing component of the data processing system. An interrupt may be a useful mechanism for notifying the data processing component, because of the associated ability (using pre-existing mechanisms) for the interrupt to affect the power state of the data processing component. In particular, an interrupt may be used to wake the data processing component from a low power state to an active state, whereby it can then respond to the notification.

Depending on the nature of the data being processed and its meaning, the at least one characteristic of the incoming data or the process data to which the processing circuitry which is responsive may take a variety of forms. In some embodiments the at least one characteristic of the incoming data or the processed data comprises at least one of: a value represented by the incoming data or the processed data crossing a threshold value; an event represented by the incoming data or the processed data; an amount of the incoming data or the processed data; and a rate of reception of the incoming data or the processed data. This flexibility in the characteristic allows for a useful interface device which can then operate autonomously of the remainder of the data processing system and in particular of the data processing component, and yet when the nature of the data which the interface device is handling requires, the data processing component can be involved. As mentioned above situations are envisaged in which the data processing component could be involved due to the quantity of data which the interface device has handled, for example because this may indicate that the data store will soon become full. Similarly the rate of reception of the incoming data or the process data could also be used to trigger notification to the data processing component. Alternatively (or in addition), a data value which is observed by the interface device may be responded to, where this data value as a particular meaning. This could for example be when the data value is above a predefined threshold, or where the data value is interpreted as having a particular meaning, for example indicating that a particular event has occurred.

In some embodiments the interface device further comprises counter circuitry to maintain a storage request count value and a storage performance count value. These count values, for example each maintained by a dedicated counter, can therefore be used to keep track of a number of requests that been received by the interface device to store data items to the data store and keep track of a number of data items which have stalled to the data store. It will therefore be understood that these counts may differ from one another, in particular because of the above discussed processing, filtering, thresholding, and so on, meaning that not every data items sent from the data processing system towards the data store and handled by the interface device will in fact result in a data item being written to the data store. These counters enable the difference between the two to be monitored.

The count values maintained by above-mentioned counter circuitry may be used in a variety of ways but in some embodiments the processing circuitry is responsive to the storage performance count value reaching a threshold count value to transmit the notification signal. For example, the threshold value for the storage performance count value can be defined such that it is indicative of the storage capacity of the data store being close to exhaustion, and therefore the data processing component of the data processing system can respond to the notification signal to address this. For example it may remove data from the data store, or delete some data.

In some embodiments the processing circuitry is one of multiple processing circuitries, and the multiple processing circuitries are responsive to a configuration signal to activate one of the multiple processing circuitries. This provides interface device with a range of configurations into one of which it can be set by means of the configuration signal. This configurability may be made use of in a variety of ways. On the one hand it provides for a generic interface device to be provided, but where only one processing circuitry of the multiple processing circuitries is used depending on the context in which the interface device is used. On the other hand it provides for an interface device which can readily be reconfigured when use by means of a configuration signal.

In recognition of this latter context some embodiments further comprise configuration signal generation circuitry to generate the configuration signal in dependence on at least one further characteristic of the incoming data or the processed data. This thus enables the processing circuitry to be changed during the operation of the interface device in dependence on the data which processes. In other words this enables the processing carried out by the processing circuitry of the interface device to be changed. One such example of this would be where it is determined that a different filtering, thresholding, compression, etc. of the data being processed would result in a more efficient size reduction of the data and therefore the processing circuitry which is active is changed to bring about this more efficient processing.

At least some example embodiments provide a data processing system comprising: a data processing component; a data store; and an interface device comprising: first interface circuitry to receive incoming data; second interface circuitry to transmit processed data to the data store for storage; and processing circuitry to generate the processed data from the incoming data, wherein the processed data has a smaller size than the incoming data, and wherein the processing circuitry is responsive to at least one characteristic of the incoming data or the processed data to transmit a notification signal to the data processing component. This data processing system may take a variety of forms, but as recognised by the above discussion the present techniques may find applicability in small data processing systems, such as a system-on-chip (SoC), with a limited power supply such as a small battery or an energy scavenging component.

In some embodiments the data processing system further comprises an sensor device to provide a source of the incoming data. A sensor device may be used to collect many different types of data from its environment, such as temperature, pH values, light levels, humidity, biometric potentials (e.g. heart rate and blood pressure), and so on. The present techniques recognise that such sensor data may be slowly changing and thus be able to benefit from the data reduction provided by the interface device of the present techniques. Moreover even in the case of relatively fast changing data oversampling can result in small differences between consecutive data points, which may also benefit from the data reduction provided by the interface device of the present techniques.

In such a data processing system there may be a range of different components within the data processing system which may send the incoming data to interface device, but in some embodiments the data processing system further comprises a memory access component to send the incoming data to the interface device. This may for example take the form of a direct memory access (DMA) device, which is capable of initiating memory accesses without the involvement of the data processing component such as a CPU.

In some embodiments the data processing system further comprises a transmission component to send data to a hub device. For example the transmission component might be a radio transmitter configured to send data read out from the data store to the hub device. As mentioned above this data read out from the data store could be read out in a compressed format, and further may remain in that compressed format for its transmission thus allowing for a smaller data package to be transmitted (for example by a radio transmitter) and therefore potentially providing a further saving to a limited power supply.

The data processing component may respond to the notification signal in a variety of ways. For example in some embodiments the data processing component is responsive to the notification signal to cause stored data to be read out from the data store. Accordingly the processing circuitry of the interface device can notify the data processing component when the storage capacity of the data store is close to exhaustion (e.g. has passed a predetermined threshold) and in response the data processing component can cause some or all of the stored data in the data store to be read out (e.g. to then be transmitted elsewhere), thus freeing up storage capacity in the data store. In some embodiments the data processing component is responsive to the notification signal to change a configuration of the processing circuitry of the interface device. Accordingly the processing circuitry can thus respond to characteristic event to notify the data processing component, which in turn causes a configuration of the processing circuitry to change, as appropriate to that characteristic event. For example, where the nature of the incoming data being received by the interface device changes, such that a different style of processing of that data would be more efficient or appropriate, this mechanism allows such a change in processing style to be effected.

At least some example embodiments provide a method of operating an interface device for a data processing system comprising: receiving incoming data at a first interface; transmitting processed data to a data store for storage from a second interface; generating the processed data from the incoming data, wherein the processed data has a smaller size than the incoming data; and transmitting a notification signal to a data processing component of the data processing system in response to at least one characteristic of the incoming data or the processed data.

At least some example embodiments provide an interface device for a data processing system comprising: first interface means for receiving incoming data; second interface means for transmitting processed data to a data store for storage; means for generating the processed data from the incoming data, wherein the processed data has a smaller size than the incoming data; and means for transmitting a notification signal to a data processing component of the data processing system in response to at least one characteristic of the incoming data or the processed data.

At least some example embodiments provide an interface device for a data processing system comprising: first interface circuitry to receive incoming data; second interface circuitry to transmit processed data to a data store for storage; and processing circuitry to generate the processed data from the incoming data, wherein the processed data has a smaller size than the incoming data.

At least some example embodiments provide an interface device for a data processing system comprising: first interface circuitry to receive incoming data; second interface circuitry to transmit processed data to a data store for storage; and processing circuitry responsive to at least one characteristic of the incoming data or the processed data to transmit a notification signal to a data processing component of the data processing system.

Some particular embodiments will now be described with reference to the figures.

FIG. 1A schematically illustrates a data processing system 10 in one embodiment. This data processing system is provided as a system-on-chip (SoC) device. The data processing system 10 comprises a central processing unit (CPU) 12, a direct memory access (DMA) device 14, a system bus 16, an interface device (DC) 18, the data store (memory) 20, a scratchpad memory 22, and a read only memory (ROM) 24. Both the CPU 12 and the DMA 14 are able to perform memory accesses with respect to the data store 20, these memory accesses being mediated by the system bus 16 and interface device 18. The interface device 18 lies on the path to the data memory, but the CPU 12 and DMA 14 need take no account of its existence, in that they write data to the data store 20 and read data from the data store 20 just as they would if the interface device 18 were not present. However, the interface device 18 is configured to dynamically process the data which it conveys from the system bus 16 to the data memory 20, in particular processing it such that a reduction in size occurs. This will be described in more detail with reference to the figures which follow. This dynamic processing to reduce the size of the data also gives the interface device the name "dynamic compressor", and hence the acronym DC. In addition the interface device 18 is responsive to the data which it processes to send a notification signal to the CPU 12 when certain criteria are met. This will also be described in more detail with reference to the figures which follow.

Figure 1B:
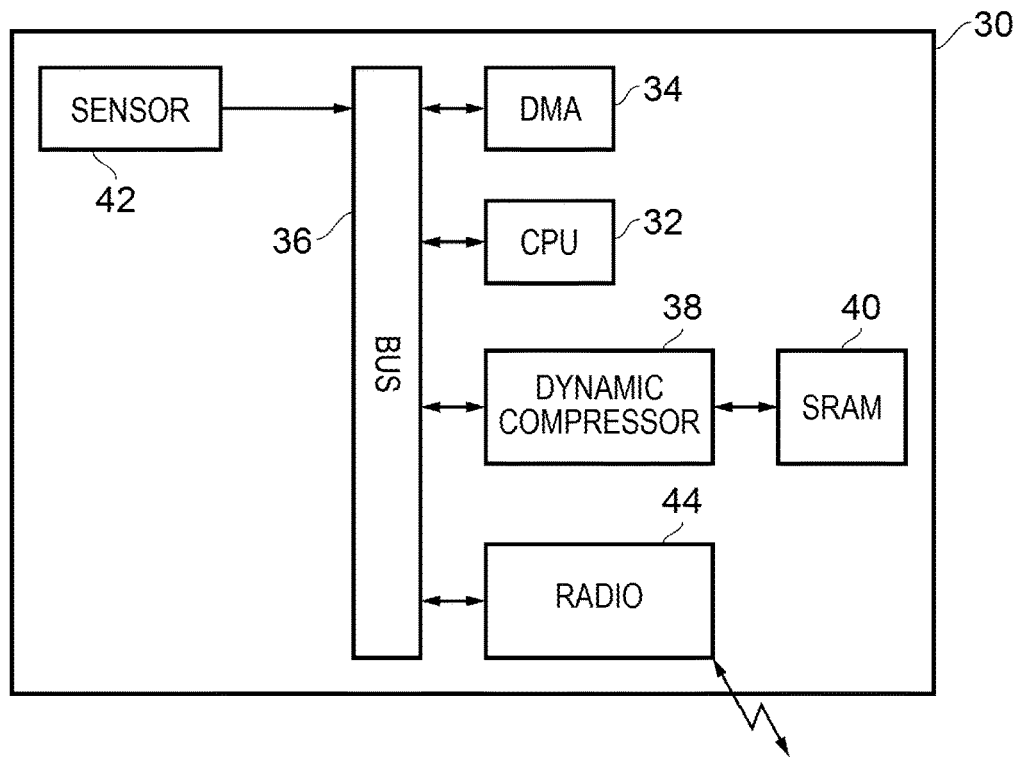
FIG. 1B schematically illustrates a data processing system comprising an interface device and a sensor component in one embodiment.

FIG. 1B schematically illustrates a data processing system 30 similar to that illustrated in FIG. 1B, with the addition of a sensor component 42 and a radio transmitter 44. This data processing system 30 also comprises a system bus 36, a DMA 34, a CPU 32, an interface device (dynamic compressor) 38, and a data store (SRAM) 40. The sensor component 42 provides a source of data samples which are periodically generated. In operation the DMA 34 administers the writing of these data samples to the SRAM 40. This in particular allowing the CPU 32 to remain in a low-power (sleep) state for a large proportion of the time. Nevertheless, the data reduction capabilities of the dynamic compressor 38 allow a significant reduction in the size of data stored to the SRAM to be achieved. The dynamic compressor 38 monitors the number of stores of data which it makes to the SRAM 40, and once this number reaches a predetermined threshold the dynamic compressor 38 transmits notification signal to the CPU 32. In this example the notification signal takes the form of an interrupt. In response the CPU activates the radio transmitter 44, causes a group of data items to be read out from the SRAM 40, and causes the radio transmitter 44 to transmit this group of data items as a data package to a predetermined recipient. In this example the data processing system 30 is envisaged as one sensor node of many, each configured to transmit sensor data in this manner to a central hub which gathers sensor data from a great number of sensor nodes for further processing.

Figure 2:
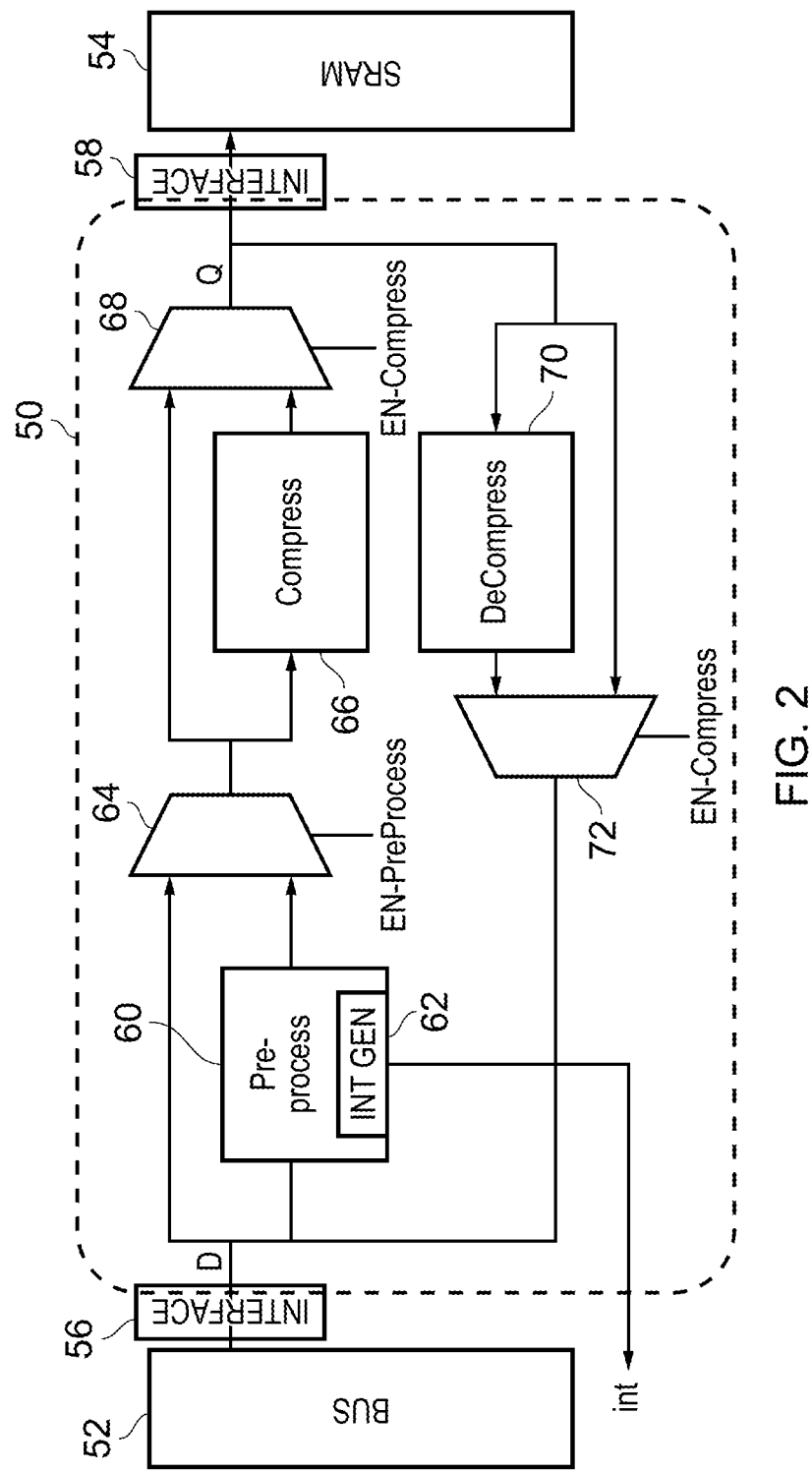
FIG. 2 schematically illustrates an interface device in one embodiment.

FIG. 2 schematically illustrates in more detail the configuration of an interface device 50 in one embodiment. The interface device 50 is situated between the system bus 52 and the SRAM 54 in the data processing system of which these components form part. Interface device 50 receives data from the system bus 52 at its first interface 56 and transmits data to the SRAM 54 from its second interface 58. Conversely when data is read out from the SRAM 54 it is received by the interface device 50 at its second interface 58 and data is transmitted to the system bus 52 via the first interface 56. The interface device comprises pre-processing circuitry 60, which is capable of performing a pre-processing of data received, and compression circuitry 66, which is capable of performing a compression operation on data. Interface device further comprises pre-process selection circuitry 64 and compression selection circuitry 68, each responsive to a respective enable signal (EN-PreProcess and EN-Compress). Accordingly, the interface device can be configured to make use of just one, both, or neither of the pre-processing circuitry 60 and the compression circuitry 66. The pre-processing circuitry 60 also comprises interrupt generation circuitry 62, and the interrupt generated by this mechanism is transmitted to a data processing component of the data processing system in which this interface device is found, such as the CPU 32 in FIG. 1B or the CPU 12 in FIG. 1A. On the read-out path of the interface device there is also decompression circuitry 70, which provides the counter operation to that of the compression circuitry 66. The compression selection circuitry 72 is also present and, in this example, is responsive to the same enable signal as the compression selection circuitry 68 (i.e. EN-Compress), such that when the compression circuitry 66 is active the decompression circuitry 70 is also active. Conversely when the compression circuitry 66 is switched off, the decompression circuitry 70 is also switched off.

Figure 3:
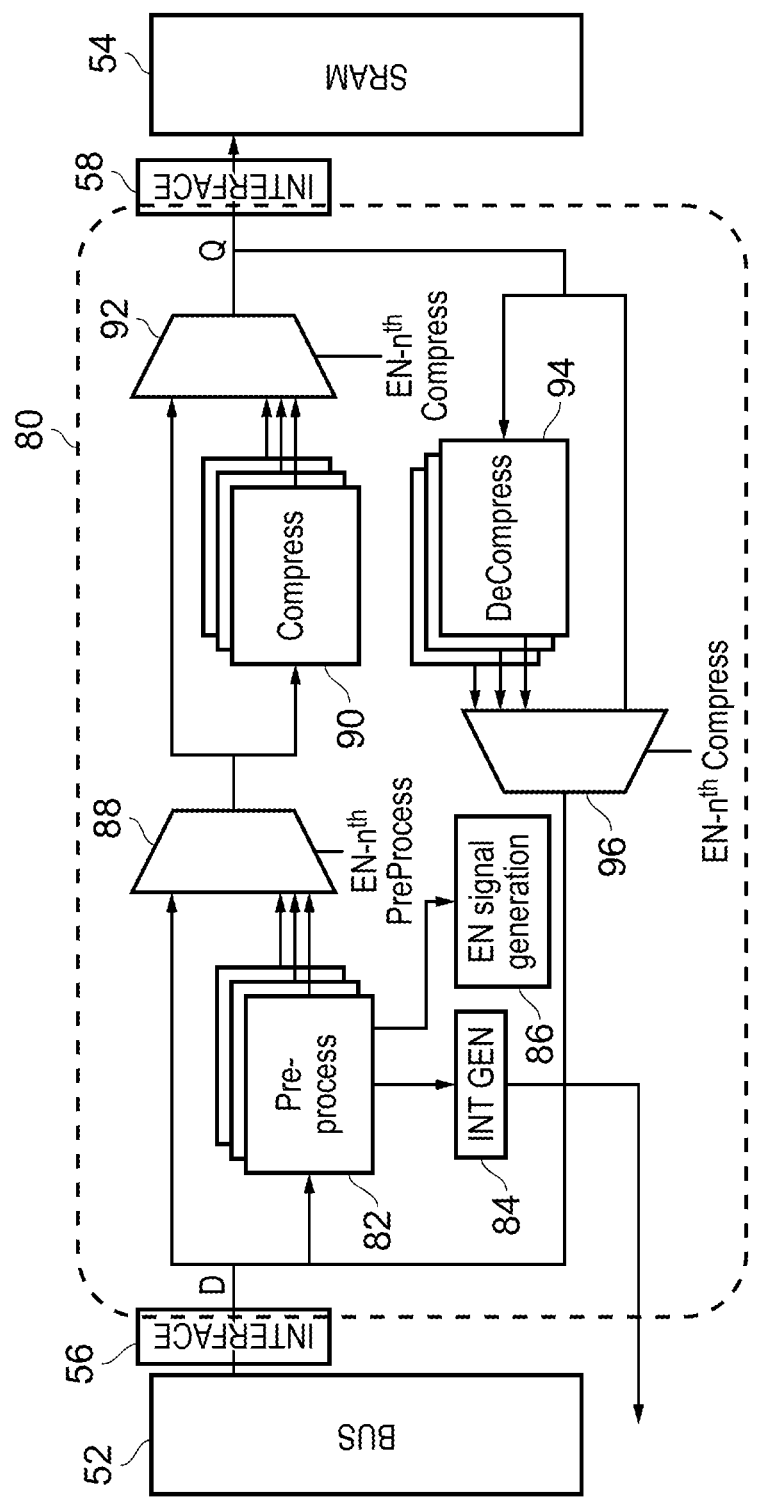
FIG. 3 schematically illustrates an interface device in one embodiment with multiple pre-processing, compression and decompression circuitries in one embodiment.

FIG. 3 schematically illustrates an interface device 80 which is a variant on the interface device 50 of FIG. 2. The interface device 80 is situated between the same system bus 52 and SRAM 54 as was the case in FIG. 2. Moreover the first interface 56 and the second interface 58 are the same as those described with respect to FIG. 2. The key difference with respect to the device of FIG. 2 is that the interface device 18 is provided with multiple pre-processing circuitries 82, multiple compression circuitries 90 and multiple decompression circuitries 94. In each case, each of these circuitries has a different configuration. Accordingly, depending on which of the pre-processing circuitry is 82 is active (and note that only one may be active at a time), a different pre-processing operation is carried out. Similarly depending on which of the compression/decompression circuitries 90, 92 is active (and noting that only one compression circuitry and one decompression circuitry can be active at a time), a different compression and decompression operation is carried out. As in the case of FIG. 2 the interface device of FIG. 3 also has interrupt generation circuitry 84 although it is noted that in the case of FIG. 3 this does not strictly form part of the pre-processing circuitry since this means that only one instance of this interrupt generation circuitry need be provided. The enable signals which select the particular pre-processing circuitry and the particular compression/decompression circuitry which are active can be provided from an external source (i.e. another part of the data processing system in which the interface device is found). This can be the case in a situation in which the interface device 80 is provided as a generic interface device, but once placed in a data processing system it is then operated with one particular configuration. In other words once in operation it may be the case that only one of the pre-processing circuitry is 82, one of decompression circuitries 90 and one of the decompression circuitry is 94 is used. However the present techniques also envisage a more dynamic selection of the configuration of the interface device 80, according to which the enable signals may change during the operation of the device. Not only may these varying enable signals come from another component of the data processing system, but it is also envisaged that the enable signal could be provided from within the interface device itself as shown by the enable signal generation circuitry 86 which forms part of interface device 80. This enable signal generation circuitry 86 receives a signal from the pre-processing circuitry 82 which is active and this then means that the enable signal generation can be made in dependence on the data which the pre-processing circuitry 82 is currently processing. Accordingly when the nature of the data being processed means that it would be preferable for a different pre-processing circuitry or compression/decompression circuitry to be active, this change can be effected.

Figure 4:
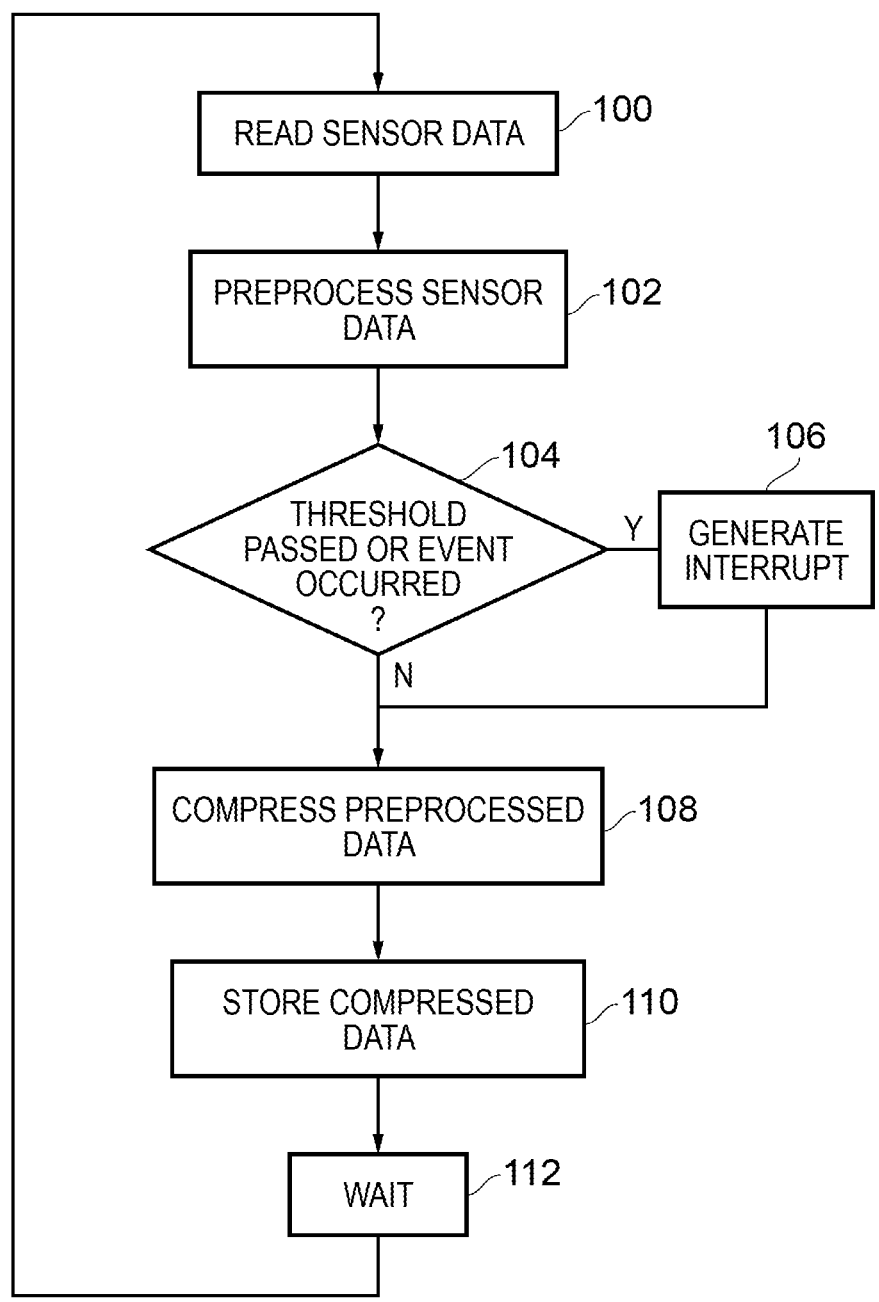
FIG. 4 shows a sequence of steps which are taken according to the method of one embodiment in operating a data processing system.

FIG. 4 shows a sequence of steps which are taken according to the method of one embodiment. The flow can be considered to begin at step 100 where sensor data is read and transmitted for storage in a data store. The transmission of this data passes via an interface device of the present techniques, and thus at step 102 the sensor data is preprocessed. This may for example take the form of filtering the sensor data and/or applying a threshold cut. Then at step 104 it is determined if a predetermined threshold has been passed or if a predetermined event has occurred. The predetermined threshold may be applicable within the data itself, such as when determining if any data value received is itself above a predetermined threshold, or it may be applicable to a group of data values, such as when determining if a number of data values received has exceeded a predetermined threshold number of data values. If this is determined to be true at step 104 then the flow proceeds via step 106 where an interrupted is generated (and transmitted to a data processing component of the data processing system). Thereafter at step 108 the interface device compresses the pre-processed data, and at step 110 the compressed data is stored to the data store. The flow waits at step 112 (until the next interval for sensor data reading has elapsed) before returning to step 100.

Figure 5:
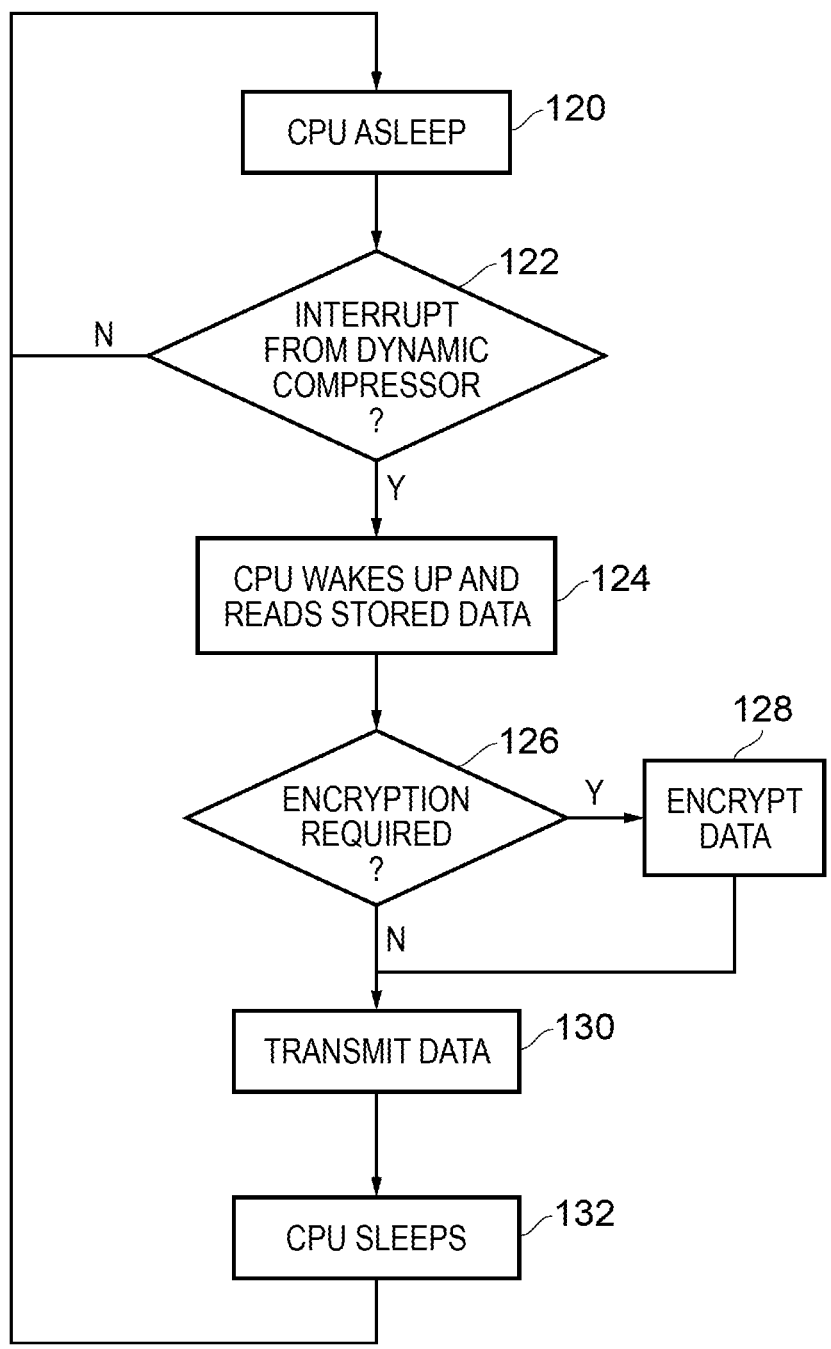
FIG. 5 shows a sequence of steps which are taken according to the method of one embodiment in operating a data processing component of a data processing system.

FIG. 5 shows a sequence of steps which are taken in operating a data processing component of a data processing system in one embodiment. The flow can be considered to begin at step 120 where the data processing component (CPU) is in a low power (sleep) mode. At step 122 it is determined if an interrupt has been received from the dynamic compressor (interface device) of the data processing system. Whilst such an interrupt is not received then the flow returns to step 120, i.e. the CPU remains asleep. However, once such an interrupt is received then the flow proceeds to step 124 where the CPU wakes up and reads stored data from the data store. At step 126 it is determined if encryption of the data before transmission is required and if this is the case the flow proceeds via step 128 where the CPU executes encryption software to encrypt the data which has been read out from the data store. Then at step 130 the data is transmitted, this for example being carried out by radio transmission in the case of the data processing system shown in FIG. 1B. The CPU then returns to its low power (sleep) state at 132 and the flow returns to step 120.

Figure 6:
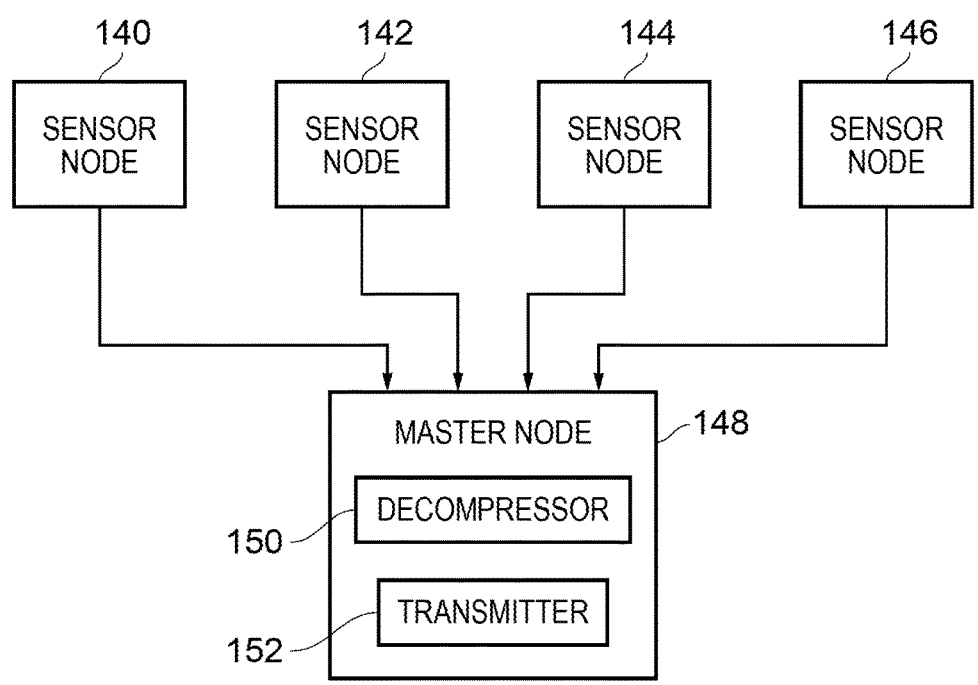
FIG. 6 schematically illustrates a set of data processing systems each being one sensor node of a set of sensor nodes coupled to a master node in one embodiment.

FIG. 6 schematically illustrates a data processing system in one embodiment which comprises multiple sensor nodes 140, 142, 144, and 146, each coupled to a master node 148. In this example the sensor nodes 140-146 represent very small individual data processing systems each with a limited processing capability and power supply. Each sensor node has a sensor component and a data processing system such as those described above. In order to further limit the processing which each individual node needs to perform, when data is read out from the data store of one of the sensor nodes 140-146 it is not the compressed, and it is communicated in its compressed form to the master node 148. This master node receives compressed data from each sensor node and is provided with a decompressor 150 which it uses to centrally perform a decompression on the data received from each. The master node 148 further comprises a transmitter 152, with which it transmits a data package comprising data from multiple sensor nodes to a predetermined destination.

Figure 7:
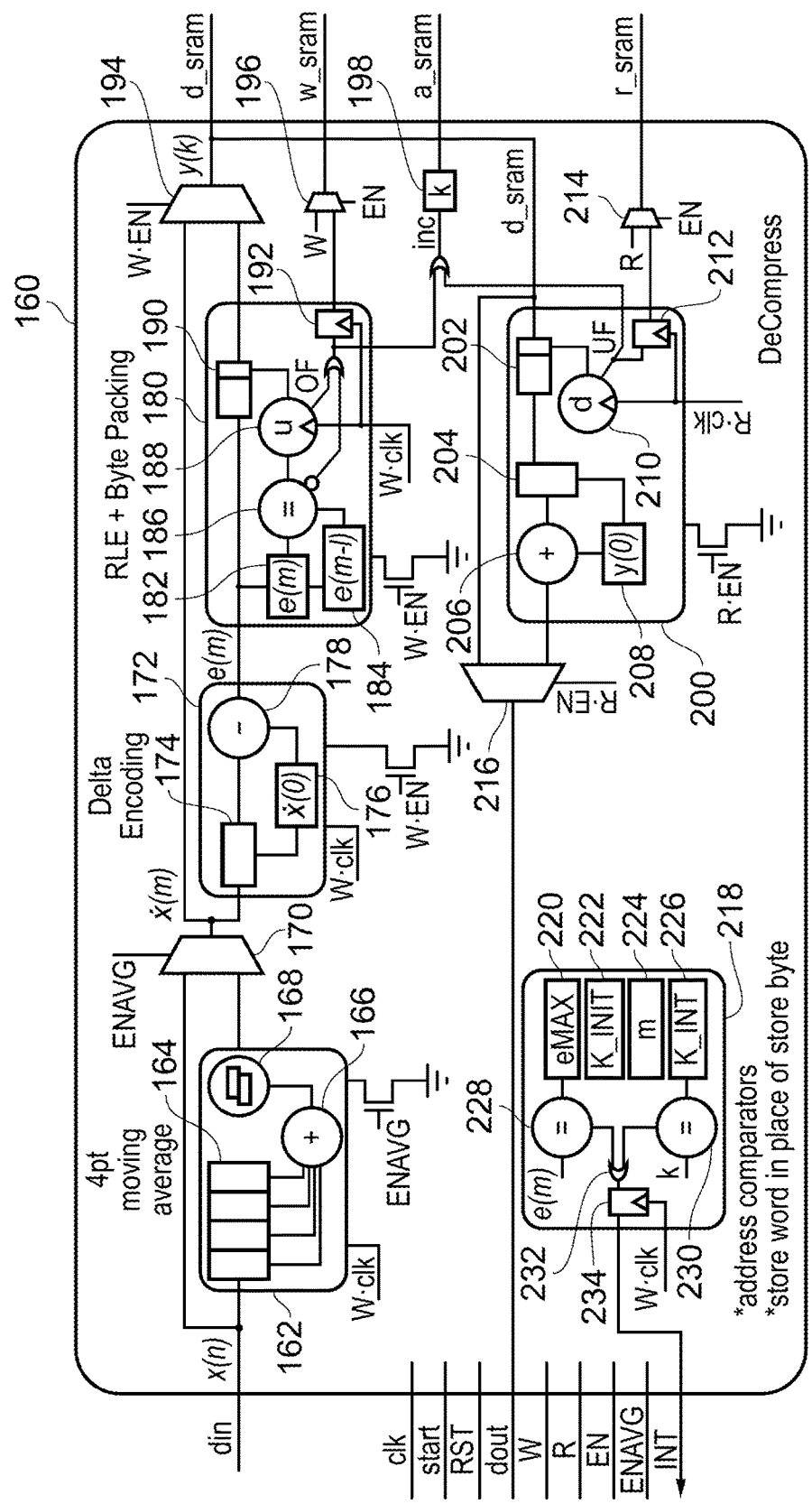
FIG. 7 schematically illustrates in more detail the configuration of an interface device in one embodiment.

FIG. 7 schematically illustrates more detail of the components of an interface device 160 in one embodiment. The incoming data stream x(n) is subjected to a four-point moving average calculation when this pre-processing is enabled (ENAVG). The four-point moving average calculation circuitry 162 comprises a buffer 164 for holding the four most recent data values, summation circuitry 166, and an output buffer 168. Selection circuitry 170 selects the output of the four-point moving average circuitry 162 or the incoming data stream in dependence on ENAVG. The resulting data $\dot{x}(m)$ (which may be the same as x(n)) can then be subjected to a two-step compression process: delta encoding by delta encoding circuitry 172 and byte-packing by byte-packing circuitry 180. This happens when the compression write enable signal (W.EN) is asserted. The delta encoded value e(m) is not the difference of consecutive samples, but the difference of the current first sample $(\dot{x}(0)-\dot{x}(m))$. The delta encoding circuitry 172 comprises input buffer 174, first sample $(\dot{x}(0))$ buffer 176, and subtraction circuitry 178. The next step (byte-packing) carried out by the byte-packing circuitry 180 gives the majority of the size reduction in the data by exploiting an expected slow changing nature of the signal (slower when averaged). In this step a two tuple structure is generated to be written to the SRAM. The first tuple is the signed delta (e(m)) and the second tuple is a count (u) 188 of how many times this delta has repeated (i.e. run length encoding). If the next successive data value is different from the current data value (i.e. e(m)−e(m−1)!=0) or if the counter overflows (OF), the packed-byte (y(k)) gets written to the SRAM (via the output d_sram). This is carried out by e(in) 182 and e(m−1) 184 providing the inputs to comparator 186, and counter (u) 188 forming the second (count) ntuple content, the two ntuples being built up in ntuple output buffer 190. The overflow OF or the negated output of the comparator 186 triggers the SRAM write signal w_sram via the flop 192 and the selector 196.

It is to be noted that the number of locations filled in memory now has no relationship to the number of times a write was actually preformed but is a function of the incoming data (x(n)). The interface device 160 is provided with counters k 198 and m 224 to keep track of how many writes were requested (in) and how many were actually performed (k) (and hence k<=m). The compression ratio achieved can be given as k:m. The counter k is used to generate the actual SRAM address (a_sram). The counter k is also used to monitor the "fullness" of the memory. A pre-determined threshold can be set-up in the K_INT 226 register so that the interface device will generate an interrupt (for the CPU of the system to which this interface device belongs) when k=K_INT. This is possible as the user/programmer of this system can know the amount of memory in the system, but cannot necessarily predict how well the real-time data will get compressed and how quickly the memory will fill up. The K_INIT register 222 holds the starting address which is loaded into counter k when start is asserted. An interrupt is also triggered by the data value e(m) matching a predefined maximum (as set in register eMAX). Comparators 228 and 230 can thus each generate an interrupt signal (via OR gate 232 and W.clk triggered flop 234).

Decompression reverses the delta encoding and byte-packing. The decompression is carried out by decompression circuitry 200. The two tuple structure is read out into buffer 202, with the counter value d 210 being set by the count ntuple, whilst the signed delta value being transferred to buffer 204. Addition circuitry 206 reconstructs the original absolute value by addition to the initial reference value y(0) 208, providing a sequence of the same value as the counter d counts down). Averaging, if enabled (ENAVG), cannot be undone. The reconstructed data value is then provided as the data output dout. The SRAM read signal r_sram is triggered by the underflow of counter d (via flop 212 and selector 214) and the next two tuple structure is read out. Note that there is also an option (R.EN dependent) for reading out the compressed data "as is", so the decompression can be done elsewhere. For example, as in the case of FIG. 6, this could using a master sensor node or similar, thus saving energy on the leaf node. Depending on the choice of compressed or decompressed data, k or in count value can be used by the system during read.

Figure 8A:
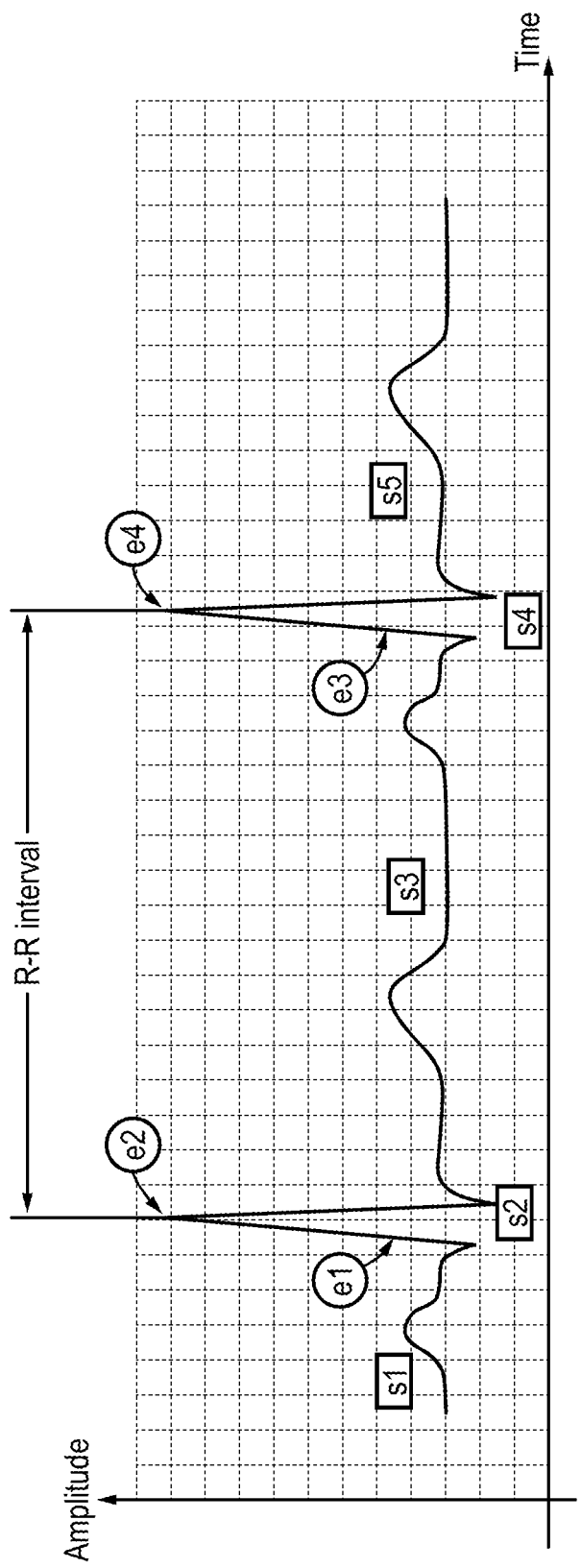
FIGS. 8A and 8B illustrate an example of electrocardiogram data being received and processed, with the interface device going through multiple modes.
Figure 8B:
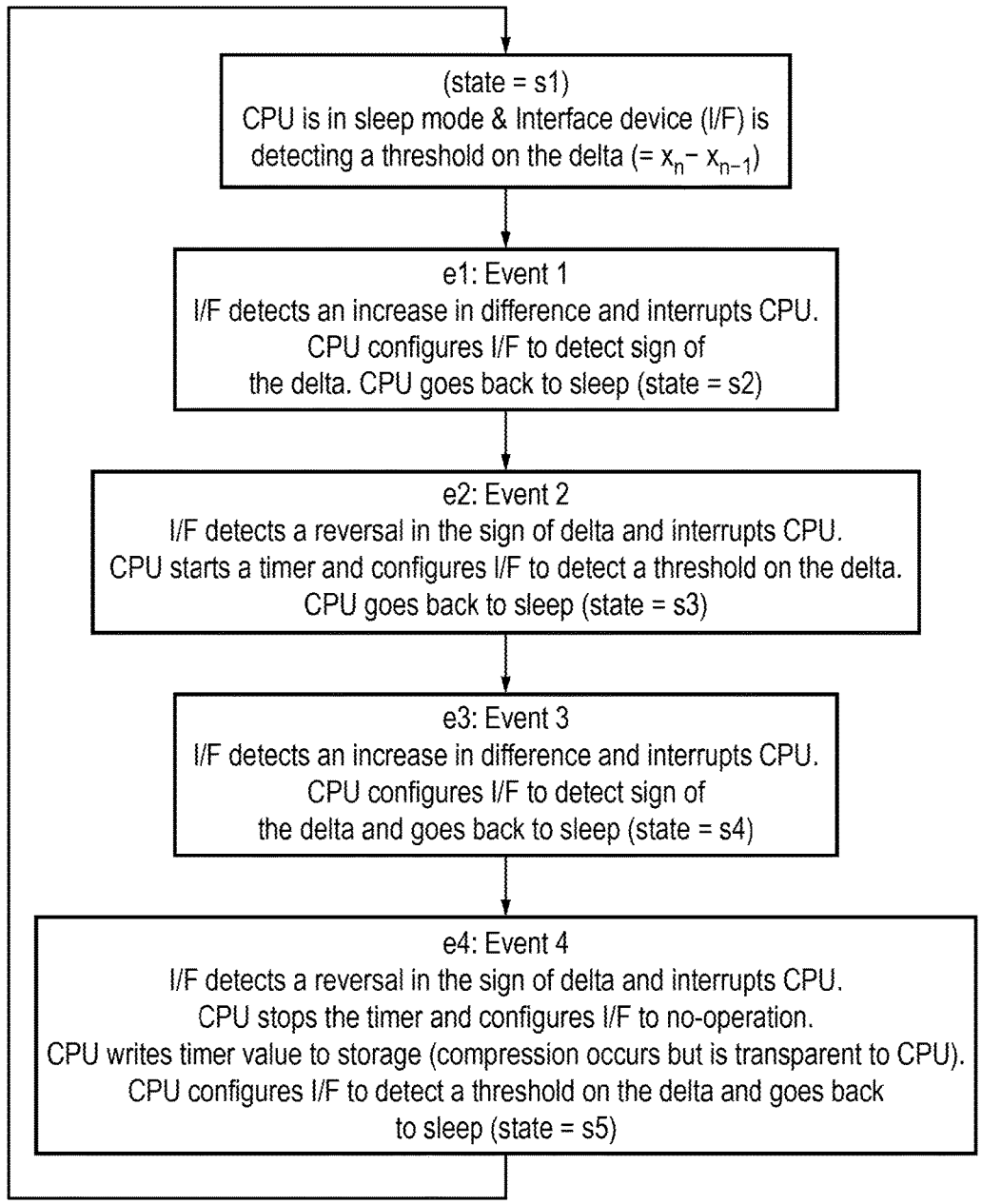

FIGS. 8A and 8B show an example where sensor data received by an interface device is electrocardiogram (ECG) data, and in particular where the application is ECG R-R (peak-peak) interval detection. FIG. 8A shows an ECG trace, with a set of event points (e1-e4) labelled, as well as a set of system states (s1-s5) through which the system transitions. The identification of the events and the movement between the system states is shown in the flow diagram of FIG. 8B. Notice in particular that the CPU spends the majority of the time in its low-power sleep mode, only being interrupted by the interface device on the occurrence of certain events to allow the CPU to intervene and change the configuration of the interface device as appropriate, before returning to sleep mode.

Figure 9A:
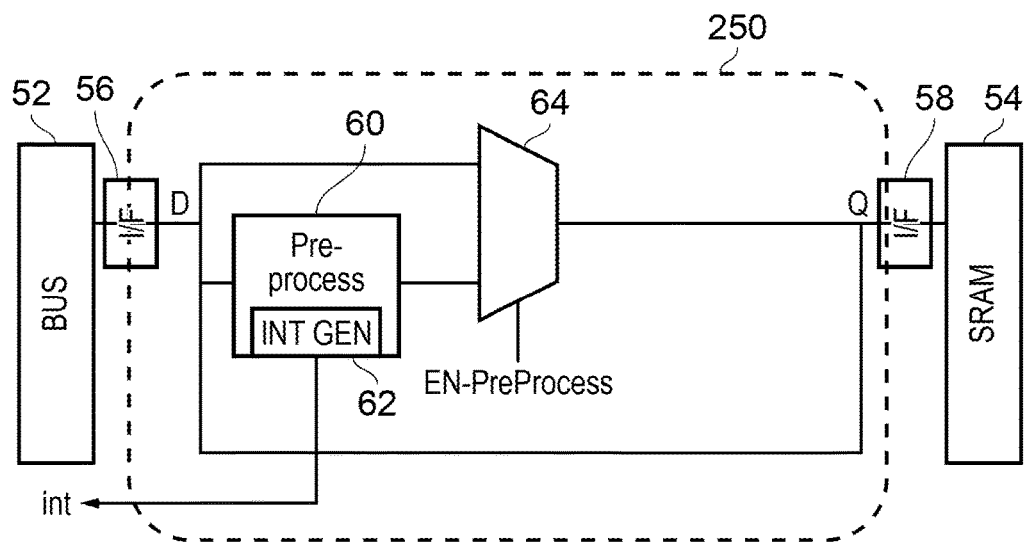
FIG. 9A schematically illustrates an interface device in one embodiment.
Figure 9B:
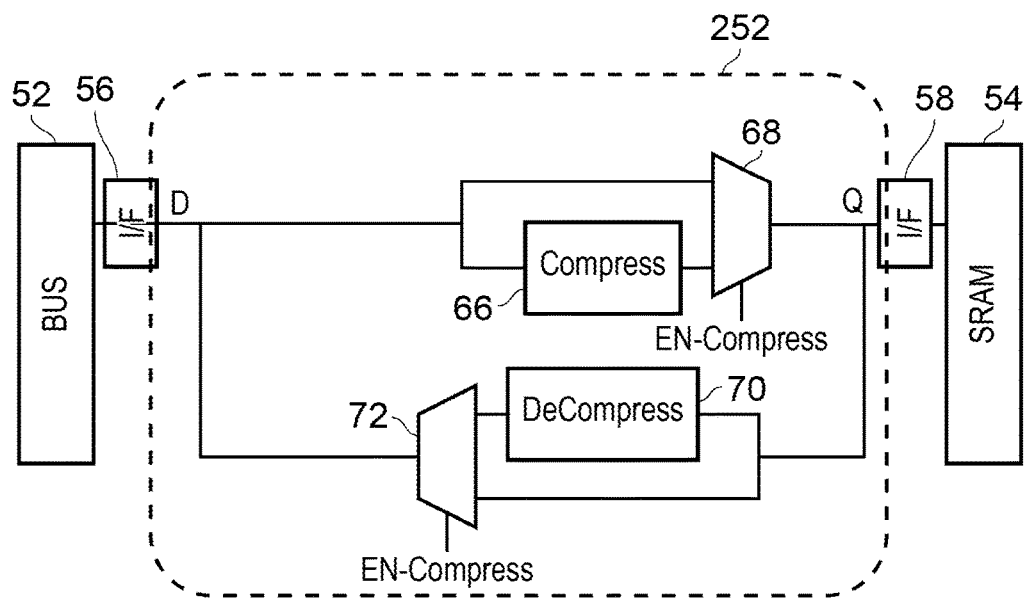
FIG. 9B schematically illustrates an interface device in one embodiment.

FIGS. 9A and 9B schematically illustrate two variants of an interface device. These represent variants on the embodiment shown in FIG. 2, and the same components have been given the same reference numerals. Thus in FIG. 9A the interface device 250 is situated between the system bus 52 and the SRAM 54 in the data processing system of which these components form part. Interface device 250 receives data from the system bus 52 at its first interface 56 and transmits data to the SRAM 54 from its second interface 58. Conversely when data is read out from the SRAM 54 it is received by the interface device 50 at its second interface 58 and data is transmitted to the system bus 52 via the first interface 56. The interface device comprises pre-processing circuitry 60, which is capable of performing a pre-processing of the data received. The interface device 250 further comprises pre-process selection circuitry 64 responsive to the pre-process enable signal (EN-PreProcess), so that the pre-processing can be selectively enabled. The pre-processing circuitry 60 also comprises interrupt generation circuitry 62, and the interrupt generated by this mechanism is transmitted to a data processing component of the data processing system in which this interface device is found, such as the CPU 32 in FIG. 1B or the CPU 12 in FIG. 1A.

In FIG. 9B the interface device 252 is situated between the system bus 52 and the SRAM 54 in the data processing system of which these components form part. Interface device 252 receives data from the system bus 52 at its first interface 56 and transmits data to the SRAM 54 from its second interface 58. Conversely when data is read out from the SRAM 54 it is received by the interface device 252 at its second interface 58 and data is transmitted to the system bus 52 via the first interface 56. The interface device comprises compression circuitry 66, which is capable of performing a compression operation on data. The interface device 252 further comprises compression selection circuitry 68 responsive to a compression enable signal (EN-Compress), so that the compression circuitry 66 can be selectively enabled. On the read-out path of the interface device there is also decompression circuitry 70, which provides the counter operation to that of the compression circuitry 66. The decompression selection circuitry 72 is also present and, in this example, is responsive to the same enable signal as the compression selection circuitry 68 (i.e. EN-Compress), such that when the compression circuitry 66 is active the decompression circuitry 70 is also active. Conversely when the compression circuitry 66 is switched off, the decompression circuitry 70 is also switched off.

In brief overall summary an interface device for a data processing system is provided. The interface device comprises first interface circuitry to receive incoming data and second interface circuitry to transmit processed data to a data store for storage. The interface device is provided with processing circuitry to generate the processed data from the incoming data wherein the processing carried out reduces the data in size. The processing circuitry is also responsive to at least one characteristic of the incoming data or the processed data to transmit a notification signal to a data processing component of the data processing system.

In the present application, the words "configured to . . ." or "arranged to" are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" or "arranged to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

We claim:

1. An interface device for a data processing system comprising:
   first interface circuitry to receive incoming data;
   second interface circuitry to transmit processed data to a data store for storage; and
   processing circuitry to generate the processed data from the incoming data, wherein the processed data has a smaller size than the incoming data, and wherein the processing circuitry comprises interrupt generation circuitry, responsive to at least one characteristic of the incoming data or the processed data, to generate and transmit an interrupt to a data processor of the data processing system, and wherein responsive to receiving the interrupt, the data processor is configured to change a power state of the data processor from a lower power, sleep state to a higher power, active state.

2. The interface device as claimed in claim 1, wherein the processing circuitry comprises compression circuitry to perform a compression operation on the incoming data to generate the processed data.

3. The interface device as claimed in claim 2, further comprising compression selection circuitry selectively to use the compression circuitry in response to a compression enable signal.

4. The interface device as claimed in claim 2, wherein the processing circuitry further comprises decompression circuitry, and
   the second interface circuitry is responsive to reception of compressed data from the data store to transmit the compressed data to the decompression circuitry,
   the decompression circuitry is responsive to reception of the compressed data from the second interface circuitry to perform a decompression operation on the compressed data to generate decompressed data, and
   the first interface circuitry is responsive to reception of the decompressed data from the decompression circuitry to transmit the decompressed data to a further component of the data processing system.

5. The interface device as claimed in claim 4, further comprising decompression selection circuitry selectively to use the decompression circuitry in response to a decompression enable signal.

6. The interface device as claimed in claim 1, wherein the processing circuitry comprises pre-processing circuitry to perform a pre-processing operation on the incoming data, wherein the pre-processing operation comprises at least one of:
   filtering the incoming data;
   difference encoding the incoming data;
   applying a threshold cut to the incoming data; and
   calculating a dynamic average from the incoming data.

7. The interface device as claimed in claim 1, wherein the at least one characteristic of the incoming data or the processed data comprises at least one of:
   a value represented by the incoming data or the processed data crossing a threshold value;
   an event represented by the incoming data or the processed data;
   an amount of the incoming data or the processed data; and
   a rate of reception of the incoming data or the processed data.

8. The interface device as claimed in claim 1, further comprising counter circuitry to maintain a storage request count value and a storage performance count value.

9. The interface device as claimed in claim 8, wherein the processing circuitry is responsive to the storage performance count value reaching a threshold count value to transmit the interrupt.

10. The interface device as claimed in claim 1, wherein the processing circuitry is one of multiple processing circuitries, and the multiple processing circuitries are responsive to a configuration signal to activate one of the multiple processing circuitries.

11. The interface device as claimed in claim 10, further comprising configuration signal generation circuitry to generate the configuration signal in dependence on at least one further characteristic of the incoming data or the processed data.

12. A data processing system comprising:
   a data processor;
   a data store; and
   an interface device comprising:
      first interface circuitry to receive incoming data;
      second interface circuitry to transmit processed data to the data store for storage; and
      processing circuitry to generate the processed data from the incoming data, wherein the processed data has a smaller size than the incoming data, and wherein the processing circuitry comprises interrupt generation circuitry, responsive to at least one characteristic of the incoming data or the processed data, to generate and transmit an interrupt to the data processor, and wherein responsive to receiving the interrupt, the data processor is configured to change a power state of the data processor from a lower power, sleep state to a higher power, active state.

13. The data processing system as claimed in claim 12, further comprising a sensor device to provide a source of the incoming data.

14. The data processing system as claimed in claim 12, further comprising a memory access component to send the incoming data to the interface device.

15. The data processing system as claimed in claim 12, further comprising a transmission component to send data to a hub device.

16. The data processing system as claimed in claim 12, wherein the data processor is responsive to the interrupt to cause stored data to be read out from the data store.

17. The data processing system as claimed in claim 12, wherein the data processor is responsive to the interrupt to change a configuration of the processing circuitry of the interface device.

18. A method of operating an interface device for a data processing system comprising:
  receiving incoming data at a first interface;
  transmitting processed data to a data store for storage from a second interface;
  generating the processed data from the incoming data, wherein the processed data has a smaller size than the incoming data;
  generating and transmitting an interrupt to a data processor of the data processing system in response to at least one characteristic of the incoming data or the processed data; and
  in response to the interrupt, changing a power state of the data processor from a lower power, sleep state to a higher power, active state.

19. An interface device for a data processing system comprising:
  first interface means for receiving incoming data;
  second interface means for transmitting processed data to a data store for storage;
  means for generating the processed data from the incoming data, wherein the processed data has a smaller size than the incoming data; and
  means for generating and transmitting an interrupt to a data processing component of the data processing system in response to at least one characteristic of the incoming data or the processed data;
  wherein responsive to receiving the interrupt, the data processing component is configured to change a power state of the data processing component from a lower power, sleep state to a higher power, active state.

* * * * *